United States Patent
Nomura et al.

(10) Patent No.: US 11,340,249 B2
(45) Date of Patent: May 24, 2022

(54) ELECTRONIC DEVICE, CALIBRATION CONTROL METHOD, AND STORAGE MEDIUM STORING PROGRAM

(71) Applicant: CASIO COMPUTER CO., LTD., Tokyo (JP)

(72) Inventors: Keiichi Nomura, Tokyo (JP); Tsuyoshi Minami, Tokyo (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 493 days.

(21) Appl. No.: 16/229,191

(22) Filed: Dec. 21, 2018

(65) Prior Publication Data

US 2019/0195907 A1   Jun. 27, 2019

(30) Foreign Application Priority Data

Dec. 25, 2017 (JP) .............................. JP2017-248212
Oct. 22, 2018 (JP) .............................. JP2018-198581

(51) Int. Cl.
*G01P 3/44* (2006.01)
*G01C 17/28* (2006.01)
(Continued)

(52) U.S. Cl.
CPC ................ *G01P 3/44* (2013.01); *G01C 17/28* (2013.01); *G01C 17/38* (2013.01); *G01P 21/00* (2013.01);
(Continued)

(58) Field of Classification Search
None
See application file for complete search history.

(56) References Cited

U.S. PATENT DOCUMENTS

2015/0019159 A1*  1/2015  Elgersma ............. G01R 35/005
                                                      702/150
2015/0115936 A1*  4/2015  Pratap .................. G01R 35/005
                                                      324/202
(Continued)

FOREIGN PATENT DOCUMENTS

CN          103874904 A       6/2014
CN          106959377 A       7/2017
WO          2013/125242 A1    8/2013

OTHER PUBLICATIONS

First Office Action dated May 29, 2020 received in Chinese Patent Application No. CN 201811594298.8 together with an English language translation.

*Primary Examiner* — Arleen M Vazquez
*Assistant Examiner* — Terence E Stifter, Jr.
(74) *Attorney, Agent, or Firm* — Scully Scott Murphy & Presser

(57) ABSTRACT

An increase in power consumption involved in calibration for calibrating an offset of a geomagnetism sensor is suppressed. An electronic device performs calibration of an output error of the geomagnetism sensor so that the geomagnetism sensor can output more accurate geomagnetism data based on angular speed data output by a gyro sensor. The electronic device controls turning ON/OFF of the gyro sensor. The electronic device determines whether or not calibration of the geomagnetism sensor is necessary. When it is determined that calibration of the geomagnetism sensor is unnecessary, the electronic device performs a control operation to turn OFF the gyro sensor.

13 Claims, 10 Drawing Sheets

(51) Int. Cl.
*G01R 33/00* (2006.01)
*G01P 21/00* (2006.01)
*G01C 17/38* (2006.01)

(52) U.S. Cl.
CPC ..... *G01R 33/0029* (2013.01); *G01R 33/0035* (2013.01)

(56) References Cited

U.S. PATENT DOCUMENTS

| | | | |
|---|---|---|---|
| 2015/0354980 A1* | 12/2015 | Wahdan | G01C 25/00 324/202 |
| 2016/0084652 A1* | 3/2016 | Sekitsu | G01C 17/28 702/94 |
| 2017/0176187 A1* | 6/2017 | Ishihama | G01C 21/165 |
| 2017/0343349 A1* | 11/2017 | Han | G01C 25/005 |
| 2018/0067173 A1* | 3/2018 | Sekitsu | G01R 33/0047 |

* cited by examiner

ELECTRONIC DEVICE, CALIBRATION CONTROL METHOD, AND STORAGE MEDIUM STORING PROGRAM

CROSS-REFERENCE TO RELATED APPLICATIONS

This application is based upon and claims the benefit of priority under 35 USC 119 of Japanese Patent Application No. 2017-248212 filed on Dec. 25, 2017, and Japanese Patent Application No. 2018-198581 filed on Oct. 22, 2018, the entire disclosure of which, including the description, claims, drawings, and abstract, is incorporated herein by reference in its entirety.

BACKGROUND OF THE INVENTION

1. Field of the Invention

The present invention relates to an electronic device, a calibration control method, and a storage medium storing a program.

2. Description of the Related Art

Conventionally, as in WO 2013/125242 A, there has been a known technology for acquiring angular speed data by using an angular speed sensor according to a rotation amount thereof to calibrate a geomagnetism sensor based on the angular speed data so that the geomagnetism sensor can output accurate magnetic data in order to rapidly estimate an offset of magnetic data output by the geomagnetism sensor.

SUMMARY OF THE INVENTION

One aspect of the embodiment is an electronic device comprising: a geomagnetism sensor; an angular speed sensor; a memory; and a processor, wherein the processor executes a program stored in the memory to perform operations comprising: performing calibration of an output error of the geomagnetism sensor so that the geomagnetism sensor is allowed to output more accurate geomagnetism data based on angular speed data output by the angular speed sensor, controlling turning ON/OFF of the angular speed sensor, determining whether or not calibration of the geomagnetism sensor is necessary, and performing a control operation to turn OFF the angular speed sensor when it is determined that calibration of the geomagnetism sensor is unnecessary.

DETAILED DESCRIPTION OF THE INVENTION

Embodiments of the present invention will be explained with reference to the drawings.

First Embodiment

[Configuration]

Figure 1:
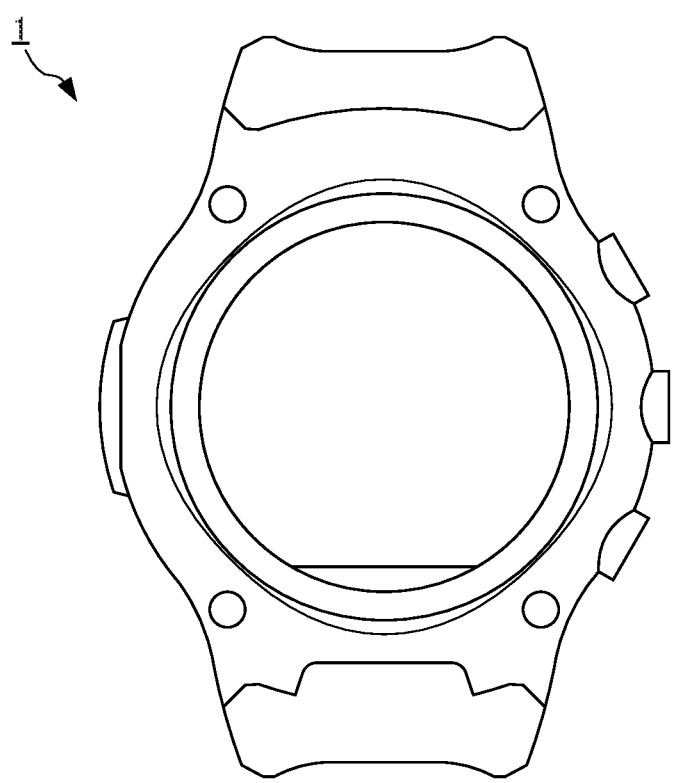
FIG. 1 is a schematic view of an electronic device corresponding to a first embodiment of the invention.

FIG. 1 is a schematic view of an electronic device 1 corresponding to a first embodiment of the invention.

As illustrated in FIG. 1, the electronic device 1 of the present embodiment is configured as a watch type device (smartwatch, etc.).

In addition, as described below, the electronic device 1 includes a geomagnetism sensor and executes calibration for calibrating an offset due to an influence of a surrounding magnetic field.

In this instance, the electronic device 1 can execute high-speed calibration using a gyro sensor and executes calibration efficiently using the gyro sensor.

Figure 2:
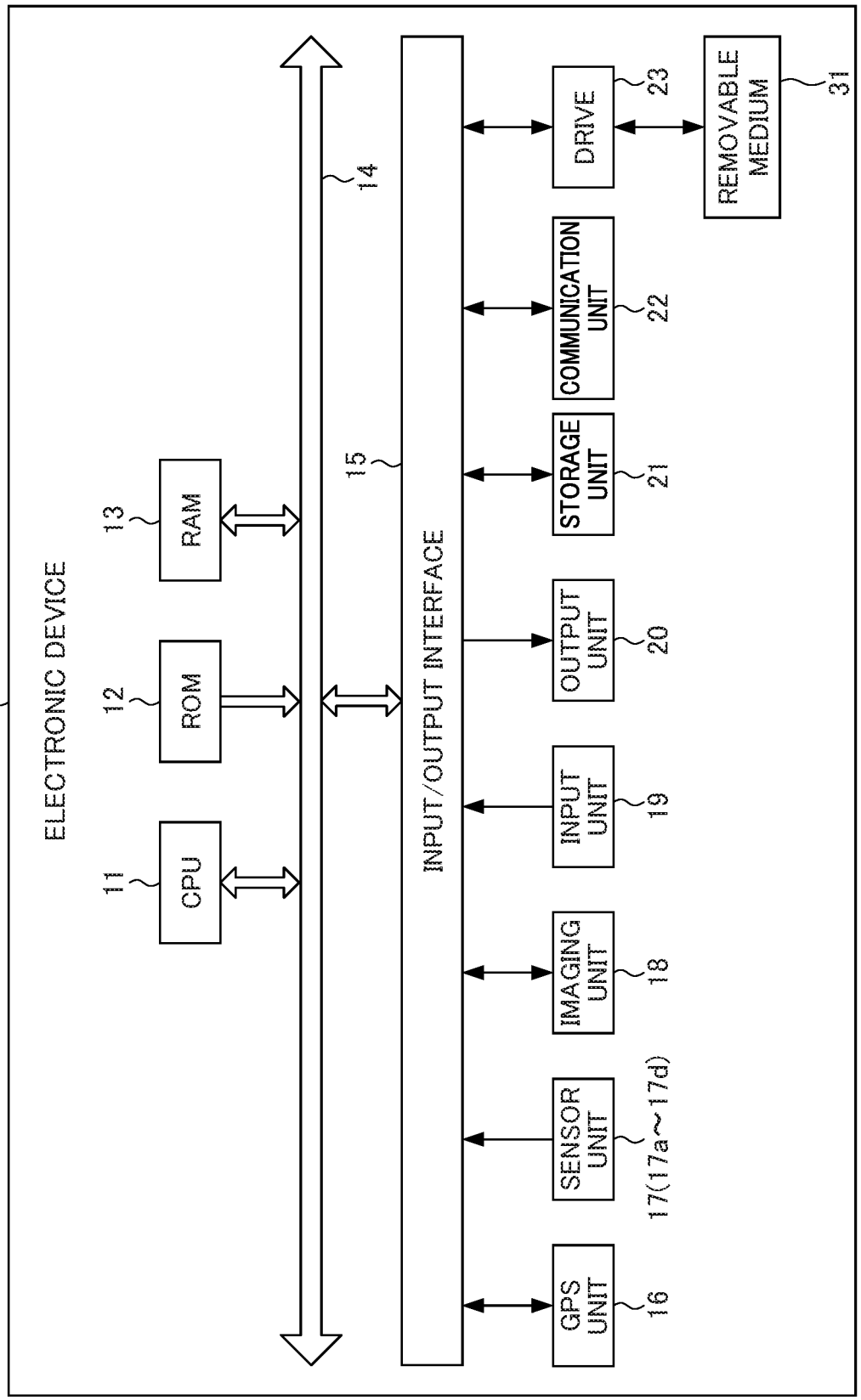
FIG. 2 is a block diagram illustrating a hardware configuration of the electronic device.

FIG. 2 is a block diagram illustrating a hardware configuration of the electronic device 1.

As illustrated in FIG. 2, the electronic device 1 includes a central processing unit (CPU) 11, a read only memory (ROM) 12, a random access memory (RAM) 13, a bus 14, an input/output interface 15, a GPS unit 16, a sensor unit 17, an imaging unit 18, an input unit 19, an output unit 20, a storage unit 21, a communication unit 22, and a drive 23.

The CPU 11 executes various processings according to a program recorded in the ROM 12, or a program loaded in the RAM 13 from the storage unit 21.

Data or the like necessary for the CPU 11 to execute various processings, is also suitably stored in the RAM 13.

The CPU 11, the ROM 12, and the RAM 13 are connected to each other through the bus 14. In addition, the input/output interface 15 is also connected to the bus 14. The GPS unit 16, the sensor unit 17, the imaging unit 18, the input unit 19, the output unit 20, the storage unit 21, the communication unit 22, and the drive 23 are connected to the input/output interface 115.

The GPS unit 16 receives GPS signals from a plurality of GPS satellites through a GPS receiving antenna (not illustrated).

The CPU 11 acquires position information such as information about latitude, longitude, and altitude indicating a current position of the device based on the GPS signals received by the GPS unit 16.

The sensor unit 17 includes a geomagnetism sensor 17a, a gyro sensor (angular speed sensor) 17b, an acceleration sensor 17c, and a pulse sensor 17d, and outputs data of detection results by these sensors to the CPU 11.

In addition to these sensors, the sensor unit 17 may appropriately include various sensors (an atmospheric pressure sensor, an illuminance sensor, etc.) necessary for processes executed by the electronic device 1.

Although not illustrated, the imaging unit 18 includes an optical lens unit and an image sensor.

The optical lens unit includes a lens such as, for example, a focus lens, a zoom lens, or the like that collects light in order to photograph a subject.

The focus lens is a lens that forms a subject image on a light receiving surface of the image sensor. The zoom lens is a lens that causes a focal length to be freely changed within a certain range.

Further, a peripheral circuit for adjusting setting parameters such as focus, exposure, white balance, and the like is installed in the imaging section 216 if necessary.

The image sensor is configured of a photoelectric conversion element, an analog front end (AFE), or the like.

The photoelectric conversion element, for example, is configured of a complementary metal oxide semiconductor (CMOS) type photoelectric conversion element or the like. The subject image is incident on the photoelectric conversion element from the optical lens unit. Then, the photoelectric conversion element performs photoelectric conversion (imaging) with respect to the subject image, accumulates an image signal for a constant time, and sequentially supplies the accumulated image signals to the AFE, as an analog signal.

The AFE executes various signal processings such as analog/digital (A/D) conversion processing, with respect to the analog image signal. A digital signal is generated by the various signal processings, and is output as an output signal from the imaging section 216.

Such output signal from the imaging section 216 will be referred to as "imaged picture data". Imaged picture data is suitably supplied to the CPU 211 ant the like. A The input unit 218 is configured of various buttons, a touch panel, or the like, and inputs various information items according to an instruction and an operation of the user.

The output unit 219 is configured of a display, a speaker, or the like, and outputs an image or a sound. [0019]

In the present embodiment, the input unit 19 capable of performing an input operation such as touching or swiping is disposed in an overlapping manner on the output unit 20 serving as a display for displaying an image, an icon, etc., and is included in a touch panel that serves as an interface.

The storage unit 21 includes a semiconductor memory such as a dynamic random access memory (DRAM) and stores data of various images.

The communication unit 22 controls communication with other devices (not illustrated) via a network including the Internet.

A removable medium 31 made of a magnetic disk, an optical disc, a magneto-optical disc, a semiconductor memory, etc. is appropriately mounted on the drive 23.

A program read from the removable medium 31 by the drive 23 is installed in the storage unit 21 as necessary.

In addition, the removable medium 31 can store various data such as data of an image stored in the storage unit 21 similarly to the storage unit 21.

Figure 3:
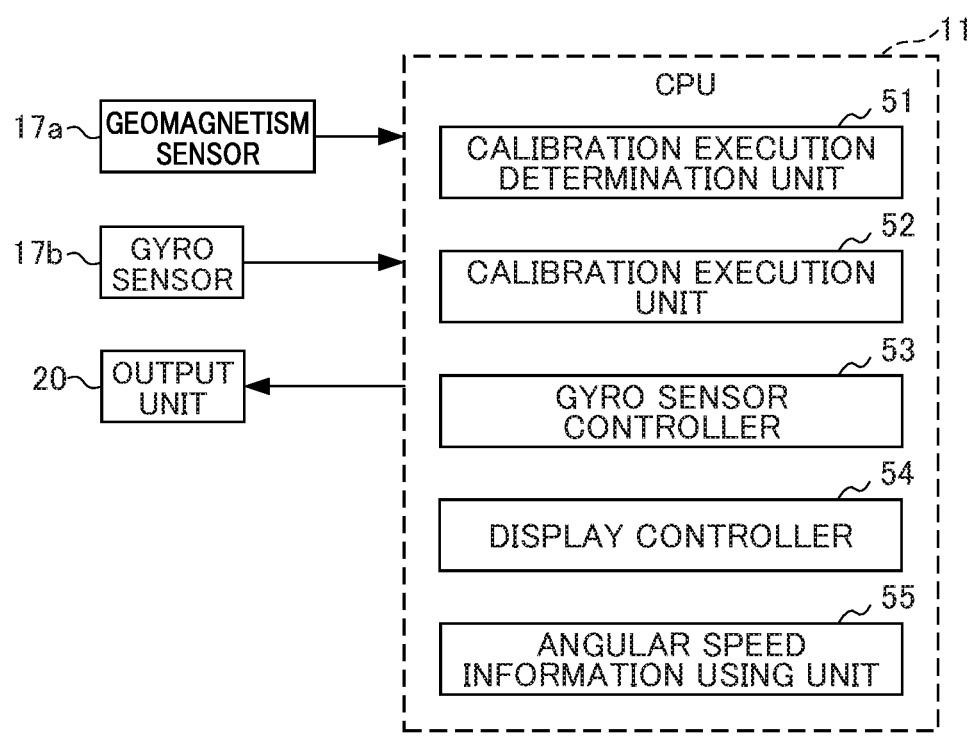
FIG. 3 is a functional block diagram illustrating a functional configuration for executing a calibration control process in a functional configuration of the electronic device of FIG. 1.

FIG. 3 is a functional block diagram illustrating a functional configuration for executing a calibration control process in a functional configuration of the electronic device 1 of FIG. 1.

The calibration control process refers to a series of processes for executing high-speed calibration using the gyro sensor by more efficiently using the gyro sensor in the electronic device 1.

When the calibration control process is executed, as illustrated in FIG. 3, a calibration execution determination unit 51, a calibration execution unit 52, a gyro sensor controller 53, a display controller 54, and an angular speed information using unit 55 function in the CPU 11.

The calibration execution determination unit 51 determines whether or not calibration of the geomagnetism sensor 17a is necessary in the electronic device 1.

For example, the calibration execution determination unit 51 determines a first determination condition for determining whether or not calibration is necessary based on an operation executed in the electronic device 1.

As the first determination condition, for example, it is determined whether or not the user has activated an application of an electronic compass, whether or not the user has made an input to give a command on calibration of the geomagnetism sensor 17a (or has performed an operation for calibration (an operation of drawing a FIG. 8, etc.)), whether or not a specific action has been detected in the electronic device 1, etc.

Examples of the specific action include walking, termination of charging, an operation of visually recognizing the electronic device 1 by the user (an operation of lifting an arm), an operation of removing the electronic device 1 from the arm, etc.

With regard to the operation of visually recognizing the electronic device 1 by the user, when calibration is necessary, the electronic device 1 may generate vibration so that the user is urged to visually recognize the electronic device.

According to the first determination condition, it is possible to execute calibration of the geomagnetism sensor 17a at a timing presumed to be appropriate to execute calibration from activity of the user (use of application, an instruction to perform calibration, performing the specific action, etc.).

In addition, the calibration execution determination unit 51 determines a second determination condition for determining whether or not calibration is necessary based on an accumulation situation of errors of magnetism in the electronic device 1.

As the second determination condition, for example, an elapsed time from immediately preceding calibration is counted, it is determined whether or not the elapsed time exceeds a predetermined time, and it is determined that the second determination condition is satisfied when the predetermined time is exceeded (when a predetermined threshold value is exceeded). Alternatively, a calibration point at the time of immediately preceding calibration is identified by using the GPS unit 16, etc., a movement distance from the calibration point to a current position is measured, and it is determined that the second determination condition is satisfied when the movement distance exceeds a predetermined distance (when a predetermined threshold value is exceeded). Alternatively, a cumulative posture change amount from a posture at the time of immediately preceding calibration to a present time point is identified by using the gyro sensor 17b, etc., and it is determined that the second determination condition is satisfied when the posture change amount exceeds a predetermined change amount (when a predetermined threshold value is exceeded). Alternatively, when a cumulative magnetic field change amount detected from a time point of immediately preceding calibration to a present time point exceeds a predetermined change amount (when a predetermined threshold value is exceeded), it is determined that the second determination condition is satisfied.

It may be determined that the second determination condition is satisfied when one of the above conditions is satisfied or it may be determined that the second determination condition is satisfied when a plurality of conditions of the above conditions is satisfied.

According to the second determination condition, it is possible to execute calibration of the geomagnetism sensor 17a at a timing presumed to be appropriate to execute calibration from detection accuracy of geomagnetism in the electronic device 1.

When it is determined that calibration of the geomagnetism sensor 17a is necessary by the calibration execution determination unit 51, the calibration execution unit 52 executes calibration.

For example, when the calibration execution determination unit 51 determines that the gyro sensor 17b is not turned ON by a function other than an application using the geomagnetism sensor 17a (the angular speed information using unit 55 that acquires predetermined information based on the angular speed data) and the first determination condition is satisfied, the calibration execution unit 52 outputs an instruction to turn ON the gyro sensor 17b to the gyro sensor controller 53 and executes high-speed calibration using the gyro sensor 17b.

In addition, when a timeout set as a completion time of high-speed calibration has occurred during execution of high-speed calibration, the calibration execution unit 52 outputs an instruction to turn OFF the gyro sensor 17b to the gyro sensor controller 53 to terminate high-speed calibration, and executes normal calibration not using the gyro sensor 17b.

In addition, for example, when the calibration execution determination unit 51 determines that the gyro sensor 17b is turned ON by a function other than the application using the geomagnetism sensor 17a (the angular speed information using unit 55 that acquires predetermined information based on the angular speed data) and the first determination condition or the second determination condition is satisfied, the calibration execution unit 52 executes high-speed calibration using the gyro sensor 17b previously turned ON.

In addition, when a timeout set as a completion time of high-speed calibration has occurred during execution of high-speed calibration, the calibration execution unit 52 terminates high-speed calibration while the gyro sensor 17b is turned ON, and executes normal calibration not using the gyro sensor 17b.

The gyro sensor controller 53 turns ON or OFF the gyro sensor 17b according to an instruction of the calibration execution unit 52.

The display controller 54 displays various types of information presented to the user in the calibration control process.

For example, when the calibration execution determination unit 51 determines that the first determination condition is satisfied, the display controller 54 displays a message to urge the user to calibrate the geomagnetism sensor 17a ("Please execute calibration of the geomagnetism sensor", etc.).

In addition, the display controller 54 displays a message indicating completion of calibration ("Calibration of the geomagnetism sensor is completed", etc.) when calibration of the geomagnetism sensor 17a is completed, and an indication of executing normal calibration ("Since high-speed calibration cannot be executed, normal calibration is executed", etc.) when the timeout of high-speed calibration has occurred.

The angular speed information using unit 55 is a function unit that executes a process other than the application using the geomagnetism sensor 17a, and acquires predetermined information based on the angular speed data.

[Operation]

Next, an operation will be described.

[Calibration Control Process]

Figure 4:
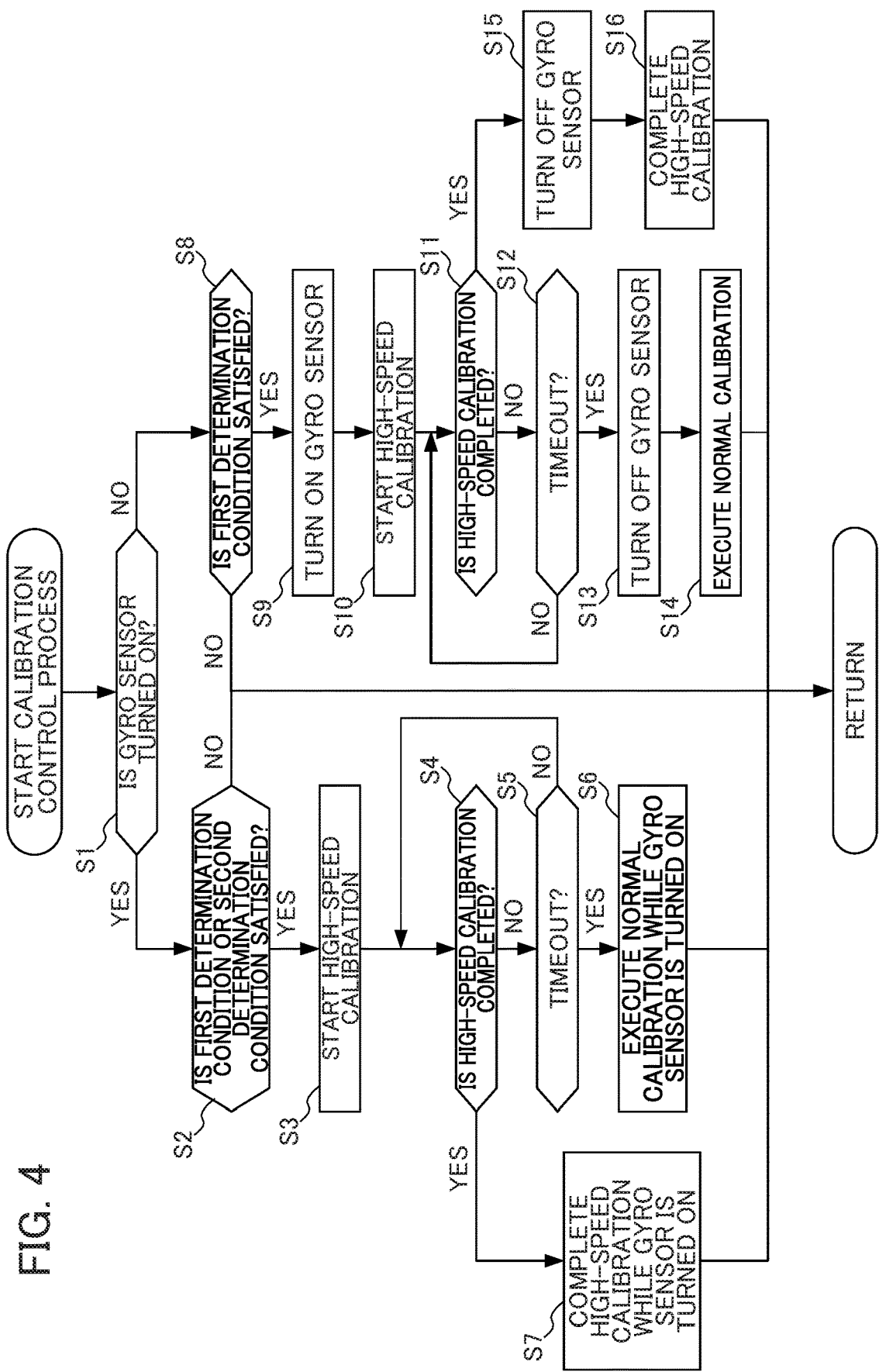
FIG. 4 is a flowchart for description of a flow of the calibration control process executed by the electronic device.

FIG. 4 is a flowchart for description of a flow of the calibration control process executed by the electronic device 1.

The calibration control process is started at a time of power activation of the electronic device 1 is turned ON, and terminated when an operation of turning OFF the power source of the electronic device 1 is performed.

In step S1, the calibration execution determination unit 51 determines whether or not the gyro sensor 17b is turned ON by a function other than the application using the geomagnetism sensor 17a (the angular speed information using unit 55 that acquires predetermined information based on the angular speed data).

When the gyro sensor 17b is not turned ON by the function other than the application using the geomagnetism sensor 17a, NO is determined in step S1, and the process proceeds to step S8.

On the other hand, when the gyro sensor 17b is turned ON by the function other than the application using the geomagnetism sensor 17a, YES is determined in step S1, and the process proceeds to step S2.

Figure 5:
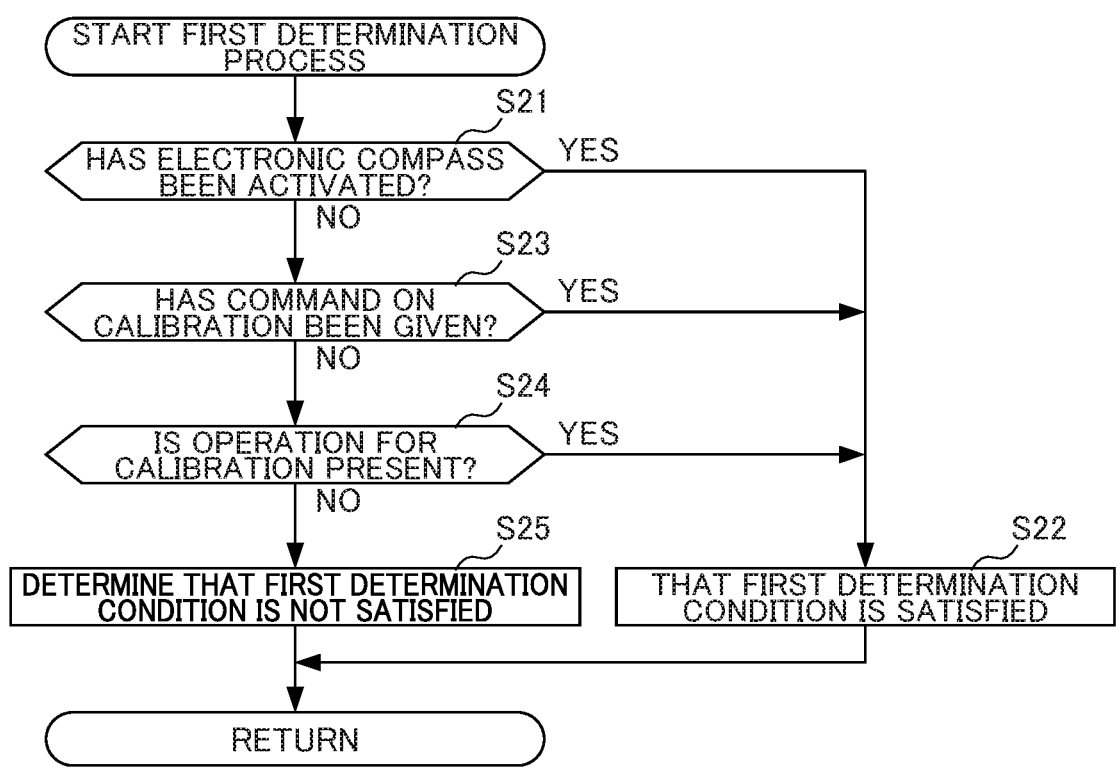
FIG. 5 is a flowchart for description of a flow of a first determination process executed by the electronic device.
Figure 6:
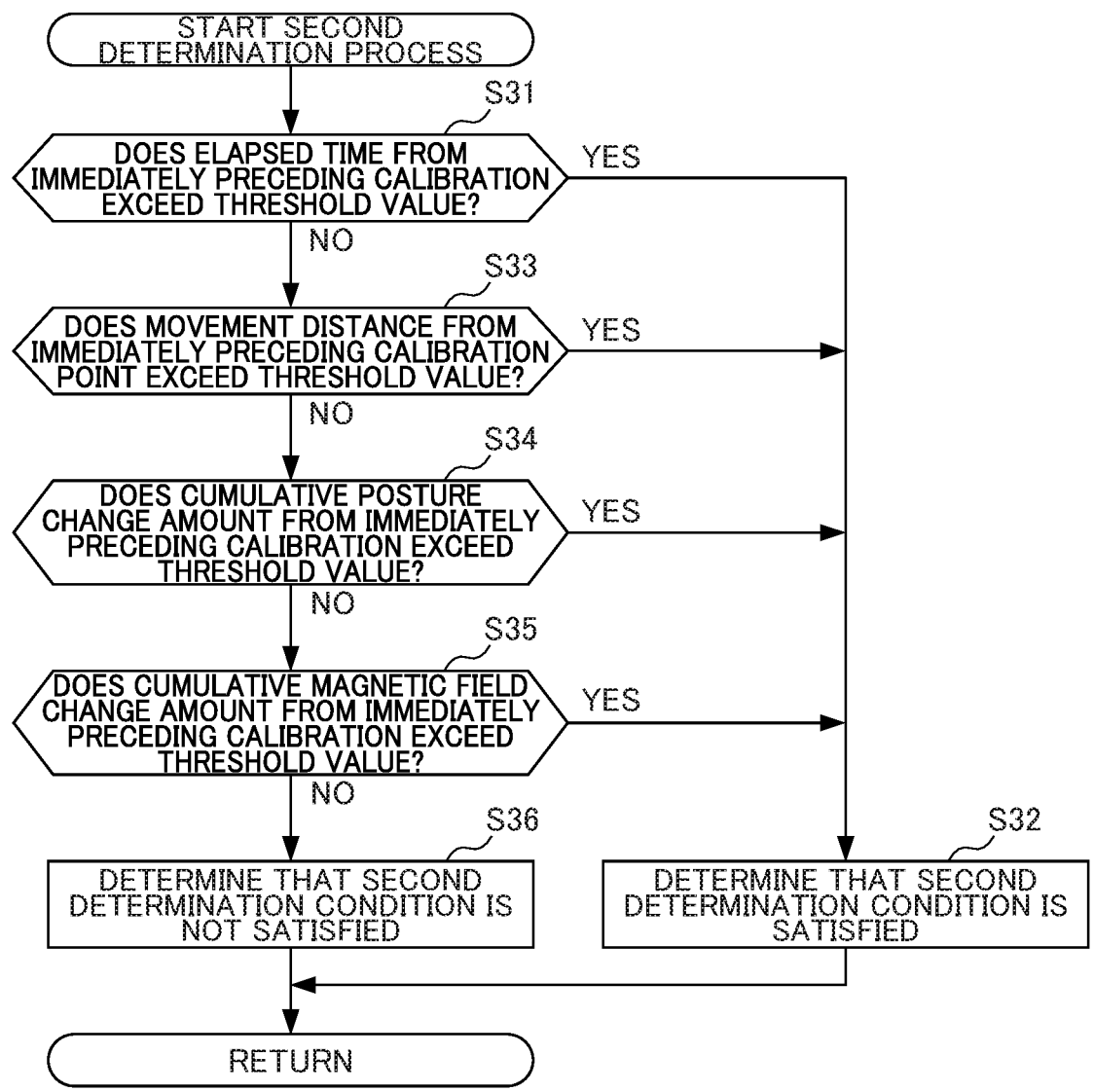
FIG. 6 is a flowchart for description of a flow of a second determination process executed by the electronic device.

In step S2, the calibration execution determination unit 51 determines whether or not the first determination condition for determining whether or not calibration is necessary based on the operation executed in the electronic device 1 or the second determination condition for determining whether or not calibration is necessary based on the accumulation situation of errors of magnetism in the electronic device 1 is satisfied by executing a first determination process (see FIG. 5) and a second determination process (see FIG. 6).

In step S2, since the gyro sensor 17b is turned ON by the function other than the application using the geomagnetism sensor 17a, whether or not calibration is necessary to utilize the gyro sensor 17b which is turned ON is determined from viewpoints of both the first determination condition and the second determination condition.

In this way, in a situation in which the gyro sensor 17b is turned ON, it is possible to determine whether or not calibration is necessary from a wide range of conditions, and to make it easy to perform calibration.

When the first determination condition or the second determination condition is satisfied, YES is determined in step S2, and the process proceeds to step S3.

On the other hand, when the first determination condition and the second determination condition are not satisfied, NO is determined in step S2, and the calibration control process is repeated.

In step S3, the calibration execution unit 52 starts high-speed calibration using the gyro sensor 17b which is previously turned ON.

In step S4, the calibration execution unit 52 determines whether or not high-speed calibration is completed.

When high-speed calibration is not completed, NO is determined in step S4, and the process proceeds to step S5.

On the other hand, when high-speed calibration is completed, YES is determined in step S4, and the process proceeds to step S7.

In step S5, the calibration execution unit 52 determines whether or not the timeout set as the completion time of high-speed calibration has occurred.

When the timeout set as the completion time of high-speed calibration has not occurred, NO is determined in step S5, and the process proceeds to step S4.

On the other hand, when the timeout set as the completion time of high-speed calibration has occurred, YES is determined in step S5, and the process proceeds to step S6.

In step S6, the calibration execution unit 52 suspends high-speed calibration while the gyro sensor 17b is turned ON to execute normal calibration not using the gyro sensor 17b.

After step S6, the calibration control process is repeated.

In step S7, the calibration execution unit 52 completes high-speed calibration while the gyro sensor 17b is turned ON. After step S7, the calibration control process is repeated.

In step S8, the calibration execution determination unit 51 determines whether or not the first determination condition for determining whether or not calibration is necessary based on an operation executed in the electronic device 1 is satisfied by executing the first determination process.

In step S8, since the gyro sensor 17b is not turned ON by the function other than the application using the geomagnetism sensor 17a, the gyro sensor 17b is turned ON under a limited condition, and thus whether or not calibration is necessary is determined only from the viewpoint of the first determination condition.

In this way, in a situation in which the gyro sensor 17b is not turned ON, it is possible to more limitedly determine whether or not calibration is necessary, and to make performance of calibration difficult when compared to a situation in which the gyro sensor 17b is turned ON.

When the first determination condition is satisfied, YES is determined in step S8, and the process proceeds to step S9.

On the other hand, when the first determination condition is not satisfied, NO is determined in step S8, and the calibration control process is repeated.

In step S9, the calibration execution unit 52 outputs an instruction to turn ON the gyro sensor 17b to the gyro sensor controller 53.

In this way, the gyro sensor 17b is turned ON by the gyro sensor controller 53.

In step S10, the calibration execution unit 52 starts high-speed calibration using the gyro sensor 17b which is turned ON in step S9.

In step S11, the calibration execution unit 52 determines whether or not high-speed calibration is completed.

When high-speed calibration is not completed, NO is determined in step S11, and the process proceeds to step S12.

On the other hand, when high-speed calibration is completed, YES is determined in step S11, and the process proceeds to step S15.

In step S12, the calibration execution unit 52 determines whether or not the timeout set as the completion time of high-speed calibration has occurred.

When the timeout set as the completion time of high-speed calibration has not occurred, NO is determined in step S12, and the process proceeds to step S11.

On the other hand, when the timeout set as the completion time of high-speed calibration has occurred, YES is determined in step S12, and the process proceeds to step S13.

In step S13, the calibration execution unit 52 outputs an instruction to turn OFF the gyro sensor 17b to the gyro sensor controller 53.

In this way, the gyro sensor 17b is turned OFF by the gyro sensor controller 53.

In step S14, the calibration execution unit 52 terminates high-speed calibration to execute normal calibration not using the gyro sensor 17b.

After step S14, the calibration control process is repeated.

In step S15, the calibration execution unit 52 outputs an instruction to turn OFF the gyro sensor 17b to the gyro sensor controller 53.

In this way, the gyro sensor 17b is turned OFF by the gyro sensor controller 53.

In step S16, the calibration execution unit 52 completes high-speed calibration.

After step S16, the calibration control process is repeated.

After calibration is executed in steps S6, S7, S14, and S16, the electronic device 1 measures an elapsed time from immediately preceding calibration, a movement distance from an immediately preceding calibration point, a cumulative posture change amount from a time of immediately preceding calibration, or a cumulative magnetic field change amount from a time point of immediately preceding calibration by a background process, etc.

[First Determination Process]

Next, a description will be given of the first determination process executed in step S2 and step S8 of the calibration control process.

FIG. 5 is a flowchart for description of a flow of the first determination process executed by the electronic device 1.

In step S21, the calibration execution determination unit 51 determines whether or not the user has activated the application of the electronic compass.

When the user has activated the application of the electronic compass, YES is determined in step S21, and the process proceeds to step S22.

On the other hand, when the user has not activated the application of the electronic compass, NO is determined in step S21, and the process proceeds to step S23.

In step S22, the calibration execution determination unit 51 determines that the first determination condition is satisfied.

After step S22, the process returns to the calibration control process.

In step S23, the calibration execution determination unit 51 determines whether or not the user has made an input to give a command on calibration of the geomagnetism sensor 17a.

When the user has made the input to give the command on calibration of the geomagnetism sensor 17a, YES is determined in step S23, and the process proceeds to step S22.

On the other hand, when the user has not made the input to give the command on calibration of the geomagnetism sensor 17a, NO is determined in step S23, and the process proceeds to step S24.

Figure 8:
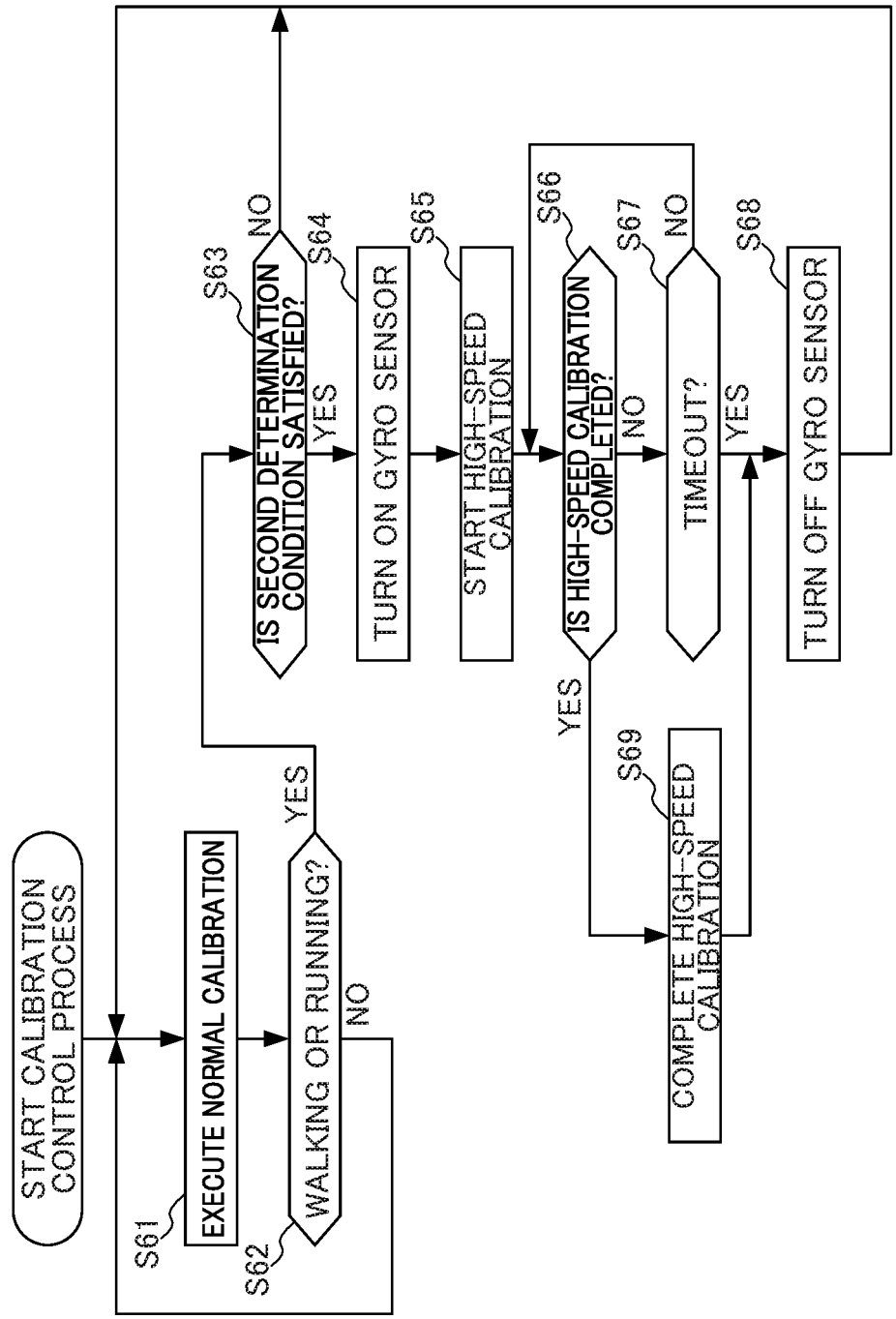
FIG. 8 is a flowchart for description of a flow of a calibration control process executed by the electronic device in a third embodiment.

In step S24, the calibration execution determination unit 51 determines whether or not the user has performed an operation for calibration (an operation of drawing a FIG. 8, etc.).

When the user has performed the operation for calibration, YES is determined in step S24, and the process proceeds to step S22.

On the other hand, when the user has not performed the operation for calibration, NO is determined in step S24, and the process proceeds to step S25.

In step S25, the calibration execution determination unit 51 determines that the first determination condition is not satisfied.

After step S25, the process returns to the calibration control process.

[Second Determination Process]

Next, a description will be given of the second determination process executed in step S2 of the calibration control process.

FIG. 6 is a flowchart for description of a flow of the second determination process executed by the electronic device 1.

In step S31, the calibration execution determination unit 51 determines whether or not an elapsed time from immediately preceding calibration exceeds a predetermined time.

When the elapsed time from immediately preceding calibration exceeds the predetermined time (predetermined threshold value), YES is determined in step S31, and the process proceeds to step S32.

On the other hand, when the elapsed time from immediately preceding calibration does not exceed the predetermined time, NO is determined in step S31, and the process proceeds to step S33.

In step S32, the calibration execution determination unit 51 determines that the second determination condition is satisfied.

After step S32, the process returns to the calibration control process.

In step S33, the calibration execution determination unit 51 determines whether or not a movement distance from a calibration point at the time of immediately preceding calibration to a current position exceeds a predetermined distance (predetermined threshold value).

When the movement distance from the calibration point at the time of immediately preceding calibration to the current position exceeds the predetermined distance, YES is determined in step S33, and the process proceeds to step S32.

On the other hand, when the movement distance from the calibration point at the time of immediately preceding calibration to the current position does not exceed the predetermined distance, NO is determined in step S33, and the process proceeds to step S34.

In step S34, the calibration execution determination unit 51 determines whether a cumulative posture change amount from a posture at the time of immediately preceding calibration to a posture at a current time point exceeds a predetermined change amount (predetermined threshold value).

When the cumulative posture change amount from the posture at the time of immediately preceding calibration to the posture at the current time point exceeds the predetermined change amount, YES is determined in step S34, and the process proceeds to step S32.

On the other hand, when the cumulative posture change amount from the posture at the time of immediately preceding calibration to the posture at the current time point does not exceed the predetermined change amount, NO is determined in step S34, and the process proceeds to step S35.

In step S35, the calibration execution determination unit 51 determines whether or not a cumulative magnetic field change amount from a time point of immediately preceding calibration to a current time point exceeds a predetermined change amount (predetermined threshold value).

When the cumulative magnetic field change amount from the time point of immediately preceding calibration to the current time point exceeds the predetermined change amount, YES is determined in step S35, and the process proceeds to step S32.

On the other hand, when the cumulative magnetic field change amount from the time point of immediately preceding calibration to the current time point does not exceed the predetermined change amount, NO is determined in step S35, and the process proceeds to step S36.

In step S36, the calibration execution determination unit 51 determines that the second determination condition is not satisfied.

After step S36, the process returns to the calibration control process.

In this way, when (i) it is determined whether or not the gyro sensor 17b is turned ON in step S1, and (ii) it is determined whether or not the first determination condition is satisfied in step S8, in a case in which the first determination condition is satisfied while the gyro sensor 17b is not turned ON in the electronic device 1, the gyro sensor 17b is turned ON to execute high-speed calibration.

Then, when high-speed calibration is completed, the gyro sensor 17b is turned OFF.

For this reason, it is possible to further reduce a period during which the gyro sensor 17b is turned ON, and to perform high-speed calibration of the geomagnetism sensor 17a with lower power consumption.

In addition, when (i) it is determined whether or not the gyro sensor 17b is turned ON in step S1, and (ii) it is determined whether or not the first determination condition and the second determination condition are satisfied in step S2, in a case in which the first determination condition or the second determination condition is satisfied while the gyro sensor 17b is turned ON in the electronic device 1, high-speed calibration is executed by using the gyro sensor 17b which is previously turned ON.

Then, when high-speed calibration is completed, a state in which the gyro sensor 17b is turned ON is maintained.

For this reason, by utilizing a timing at which the gyro sensor 17b is turned ON by the function other than the application using the geomagnetism sensor 17a (the angular speed information using unit 55 that acquires predetermined information based on the angular speed data), it is possible to perform high-speed calibration of the geomagnetism sensor 17a with lower power consumption.

That is, according to the electronic device 1, it is possible to suppress an increase in power consumption involved in calibration for calibrating an offset of the geomagnetism sensor 17a.

In addition, in the electronic device 1, in a case in which the timeout set as the completion time of high-speed calibration occurs during execution of high-speed calibration, high-speed calibration is terminated to execute normal calibration not using the gyro sensor 17b.

In this way, in the electronic device 1, when it is difficult to complete high-speed calibration due to an influence of a magnetic field environment, etc., it is possible to suppress execution of unnecessary high-speed calibration and an increase in power consumption.

Second Embodiment

In the first embodiment, in the calibration control process illustrated in FIG. 4, calibration is not normally executed, high-speed calibration is executed when a condition for executing high-speed calibration is satisfied, and normal calibration is executed when high-speed calibration is not completed.

On the other hand, it is possible to normally execute normal calibration and execute high-speed calibration when a condition for executing high-speed calibration is satisfied.

A hardware configuration of the electronic device 1 in the present embodiment is the same as the hardware configuration of the first embodiment illustrated in FIG. 2.

In addition, a functional configuration of the electronic device 1 in the present embodiment is different from that of the first embodiment in that the calibration execution unit 52 normally executes normal calibration.

Hereinafter, a description will be given of a calibration control process which is different from that of the first embodiment.

[Calibration Control Process]

Figure 7:
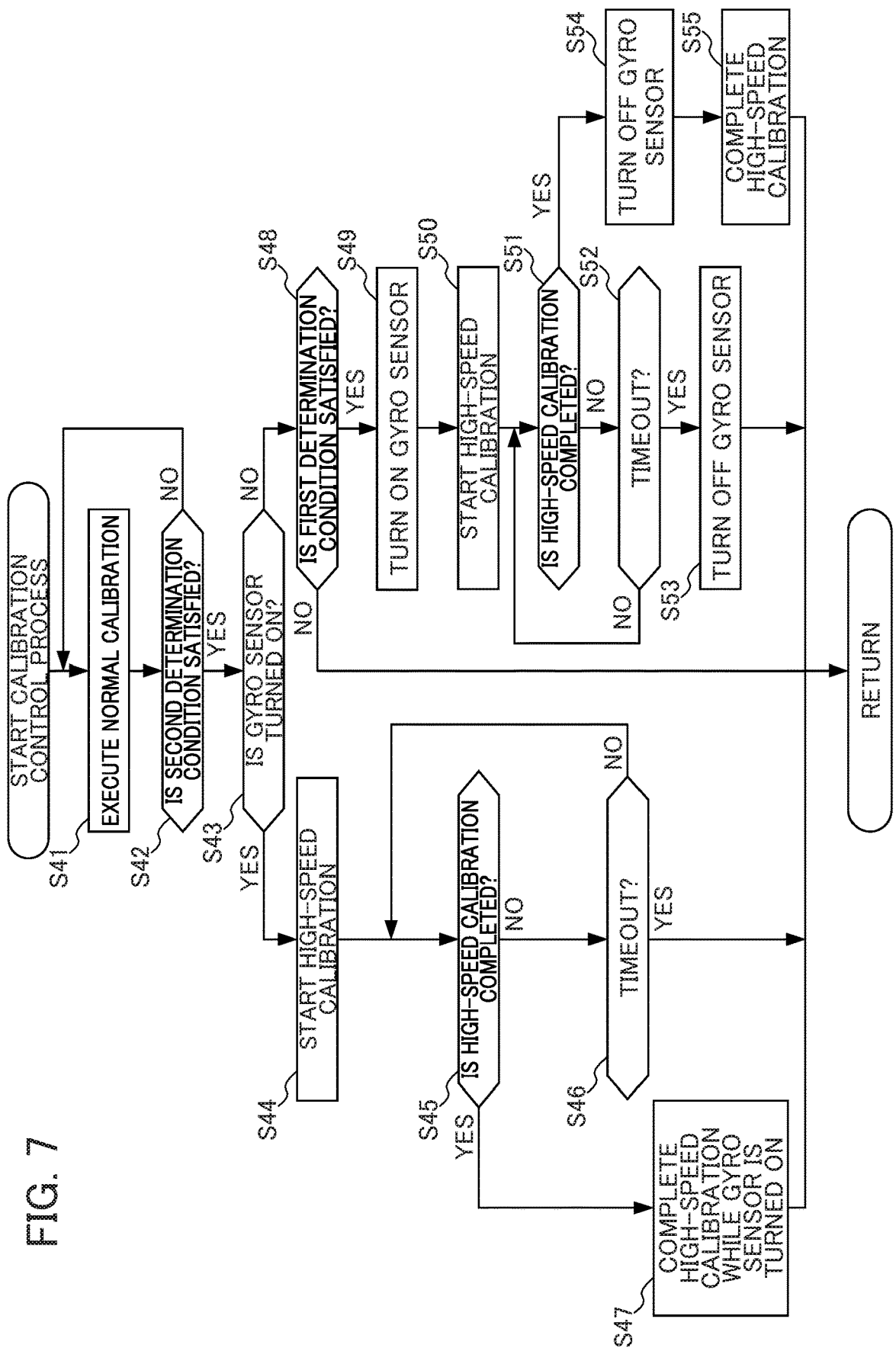
FIG. 7 is a flowchart for description of a flow of a calibration control process executed by the electronic device in a second embodiment.

FIG. 7 is a flowchart for description of a flow of the calibration control process executed by the electronic device 1 in a second embodiment.

The calibration control process is started at a time of power activation of the electronic device 1, and terminated when an operation of turning OFF the power source of the electronic device 1 is performed.

In step S41, the calibration execution unit 52 executes normal calibration not using the gyro sensor 17b.

In step S42, the calibration execution determination unit 51 determines whether or not the second determination condition for determining whether or not calibration is necessary based on an accumulation situation of errors of magnetism in the electronic device 1 is satisfied by executing the second determination process.

When the second determination condition is not satisfied, NO is determined in step S42, and the process proceeds to step S41.

On the other hand, when the second determination condition is satisfied, YES is determined in step S42, and the process proceeds to step S43.

In step S43, the calibration execution determination unit 51 determines whether or not the gyro sensor 17b is turned ON by the function other than the application using the geomagnetism sensor 17a (the angular speed information using unit 55 that acquires predetermined information based on the angular speed data).

When the gyro sensor 17b is not turned ON by the function other than the application using the geomagnetism sensor 17a, NO is determined in step S43, and the process proceeds to step S48.

On the other hand, when the gyro sensor 17b is turned ON by the function other than the application using the geomagnetism sensor 17a, YES is determined in step S43, and the process proceeds to step S44.

In step S44, the calibration execution unit 52 starts high-speed calibration using the gyro sensor 17b which is previously turned ON.

In step S45, the calibration execution unit 52 determines whether high-speed calibration is completed.

When high-speed calibration is not completed, NO is determined in step S45, and the process proceeds to step S46.

On the other hand, when high-speed calibration is completed, YES is determined in step S45, and the process proceeds to step S47.

In step S46, the calibration execution unit 52 determines whether the timeout set as the completion time of high-speed calibration has occurred.

When the timeout set as the completion time of high-speed calibration has not occurred, NO is determined in step S46, and the process proceeds to step S45.

On the other hand, when the timeout set as the completion time of high-speed calibration has occurred, YES is determined in step S46, and the calibration control process is repeated.

In step S47, the calibration execution unit 52 completes high-speed calibration while the gyro sensor 17b is turned ON.

After step S47, the calibration control process is repeated.

In step S48, the calibration execution determination unit 51 determines whether or not the first determination condition for determining whether or not calibration is necessary based on an operation executed in the electronic device 1 is satisfied by executing the first determination process.

When the first determination condition is satisfied, YES is determined in step S48, and the process proceeds to step S49.

On the other hand, when the first determination condition is not satisfied, NO is determined in step S48, and the calibration control process is repeated.

In step S49, the calibration execution unit 52 outputs an instruction to turn ON the gyro sensor 17b to the gyro sensor controller 53.

In the way, the gyro sensor 17b is turned ON by the gyro sensor controller 53.

In step S50, the calibration execution unit 52 starts high-speed calibration using the gyro sensor 17b turned ON in step S49.

In step S51, the calibration execution unit 52 determines whether or not high-speed calibration is completed.

When high-speed calibration is not completed, NO is determined in step S51, and the process proceeds to step S52.

On the other hand, when high-speed calibration is completed, YES is determined in step S51, and the process proceeds to step S54.

In step S52, the calibration execution unit 52 determines whether or not the timeout set as the completion time of high-speed calibration has occurred.

When the timeout set as the completion time of high-speed calibration has not occurred, NO is determined in step S52, and the process proceeds to step S51.

On the other hand, when the timeout set as the completion time of high-speed calibration has occurred, YES is determined in step S52, and the process proceeds to step S53.

In step S53, the calibration execution unit 52 outputs an instruction to turn OFF the gyro sensor 17b to the gyro sensor controller 53.

In this way, the gyro sensor 17b is turned OFF by the gyro sensor controller 53.

After step S53, the calibration control process is repeated.

In step S54, the calibration execution unit 52 outputs an instruction to turn OFF the gyro sensor 17b to the gyro sensor controller 53.

In this way, the gyro sensor 17b is turned OFF by the gyro sensor controller 53.

In step S55, the calibration execution unit 52 completes high-speed calibration.

After step S55, the calibration control process is repeated.

After calibration is executed in steps S41, S47, and S55, the electronic device 1 measures an elapsed time from immediately preceding calibration, a movement distance from an immediately preceding calibration point, a cumulative posture change amount from a time of immediately preceding calibration, or a cumulative magnetic field change amount from a time point of immediately preceding calibration by a background process, etc.

According to such a process, in the electronic device 1, while normal calibration is normally executed, high-speed calibration may be executed by using the gyro sensor 17b when a condition for executing high-speed calibration is satisfied.

Therefore, it is possible to rapidly ensure accuracy of the geomagnetism sensor 17a by executing high-speed calibration when necessary while maintaining accuracy of the geomagnetism sensor 17a usually.

Third Embodiment

In the first embodiment and the second embodiment, a description has been given of an example in which high-speed calibration is executed when the gyro sensor 17b is used by an application other than the application using the geomagnetism sensor 17a.

A hardware configuration of the electronic device 1 in the present embodiment is the same as the hardware configuration of the first embodiment illustrated in FIG. 2.

In addition, a functional configuration of the electronic device 1 in the present embodiment is different from that of the first embodiment and the second embodiment in that walking or running of the user is detected by the calibration execution determination unit 51 and the gyro sensor 17b is temporarily turned ON to execute high-speed calibration when the second determination condition is satisfied.

Hereinafter, a description will be given of a calibration control process which is different from that of the first embodiment and the second embodiment.

[Calibration Control Process]

FIG. 8 is a flowchart for description of a flow of the calibration control process executed by the electronic device 1 in the third embodiment.

The calibration control process is started at a time of power activation of the electronic device 1, and terminated when an operation of turning OFF the power source of the electronic device 1 is performed.

In step S61, the calibration execution unit 52 executes normal calibration not using the gyro sensor 17b.

In step S62, the calibration execution determination unit 51 determines whether or not the user is walking or running by analyzing an action of the user.

A reason for determining whether or not the user is walking or running is that calibration can be efficiently executed by using the motion.

Here, it is determined whether or not the user is walking or running. However, it is possible to determine a motion other than walking or running when the motion can be used for execution of calibration.

When the user is neither walking nor running, NO is determined in step S62, and the process proceeds to step S61.

On the other hand, when the user is walking or running, YES is determined in step S62, and the process proceeds to step S63.

In step S63, the calibration execution determination unit 51 determines whether or not the second determination condition for determining whether or not calibration is necessary based on an accumulation situation of errors of magnetism in the electronic device 1 is satisfied by executing the second determination process.

When the second determination condition is not satisfied, NO is determined in step S63, and the process proceeds to step S61.

On the other hand, when the second determination condition is satisfied, YES is determined in step S63, and the process proceeds to step S64.

It is possible to invert a processing order of determination as to whether or not the user is walking or running in step S61 and determination as to whether or not the second determination condition is satisfied in step S63.

In step S64, the calibration execution unit 52 outputs an instruction to turn ON the gyro sensor 17b to the gyro sensor controller 53.

In this way, the gyro sensor 17b is turned ON by the gyro sensor controller 53.

In step S65, the calibration execution unit 52 starts high-speed calibration using the gyro sensor 17b which is turned ON in step S64.

In step S66, the calibration execution unit 52 determines whether or not high-speed calibration is completed.

When high-speed calibration is not completed, NO is determined in step S66, and the process proceeds to step S67.

On the other hand, when high-speed calibration is completed, YES is determined in step S66, and the process proceeds to step S69.

In step S67, the calibration execution unit 52 determines whether or not the timeout set as the completion time of high-speed calibration has occurred.

When the timeout set as the completion time of high-speed calibration has not occurred, NO is determined in step S67, and the process proceeds to step S66.

On the other hand, when the timeout set as the completion time of high-speed calibration has occurred, YES is determined in step S67, and the process proceeds to step S68.

In step S68, the calibration execution unit 52 outputs an instruction to turn OFF the gyro sensor 17b to the gyro sensor controller 53.

In this way, the gyro sensor 17b is turned OFF by the gyro sensor controller 53.

After step S68, the process proceeds to step S61.

In step S69, the calibration execution unit 52 completes high-speed calibration.

After step S69, the process proceeds to step S68.

After calibration is executed in steps S61 and S68, the electronic device 1 measures an elapsed time from immediately preceding calibration, a movement distance from an immediately preceding calibration point, a cumulative posture change amount from a time of immediately preceding calibration, or a cumulative magnetic field change amount from a time point of immediately preceding calibration by a background process, etc.

According to such a process, in the electronic device 1, the gyro sensor is turned OFF as much as possible while normally executing normal calibration, and the gyro sensor 17b is turned ON to execute high-speed calibration when walking or running of the user (that is, a motion of the user usable for calibration) is detected.

Therefore, it is possible to further reduce the period during which the gyro sensor 17b is turned ON, and it is possible to perform high-speed calibration of the geomagnetism sensor 17a with lower power consumption while maintaining accuracy of the geomagnetism sensor 17a usually.

Fourth Embodiment

In the third embodiment, normal calibration is normally executed, and the gyro sensor 17b is temporarily turned ON to execute high-speed calibration when it is determined that the user is walking or running and the second determination condition is satisfied.

On the other hand, while the geomagnetism sensor 17a is normally turned OFF so that normal calibration is not performed, the geomagnetism sensor 17a may be turned ON to execute normal calibration when it is determined that the user is walking or running, and the gyro sensor 17b may be turned ON to perform high-speed calibration when the second determination condition is satisfied.

A hardware configuration of the electronic device 1 in the present embodiment is the same as the hardware configuration of the first embodiment illustrated in FIG. 2.

In addition, a functional configuration of the electronic device 1 in the present embodiment is different from that of the third embodiment in that a geomagnetism sensor controller 56 is included, and in that the geomagnetism sensor 17a is turned ON to execute normal calibration when the calibration execution determination unit 51 determines that the user is walking or running, and the gyro sensor 17b is turned ON to perform high-speed calibration when the second determination condition is satisfied.

Hereinafter, a description will be given of a functional configuration of the geomagnetism sensor controller 56 and the calibration control process which are different parts from the third embodiment.

Figure 9:
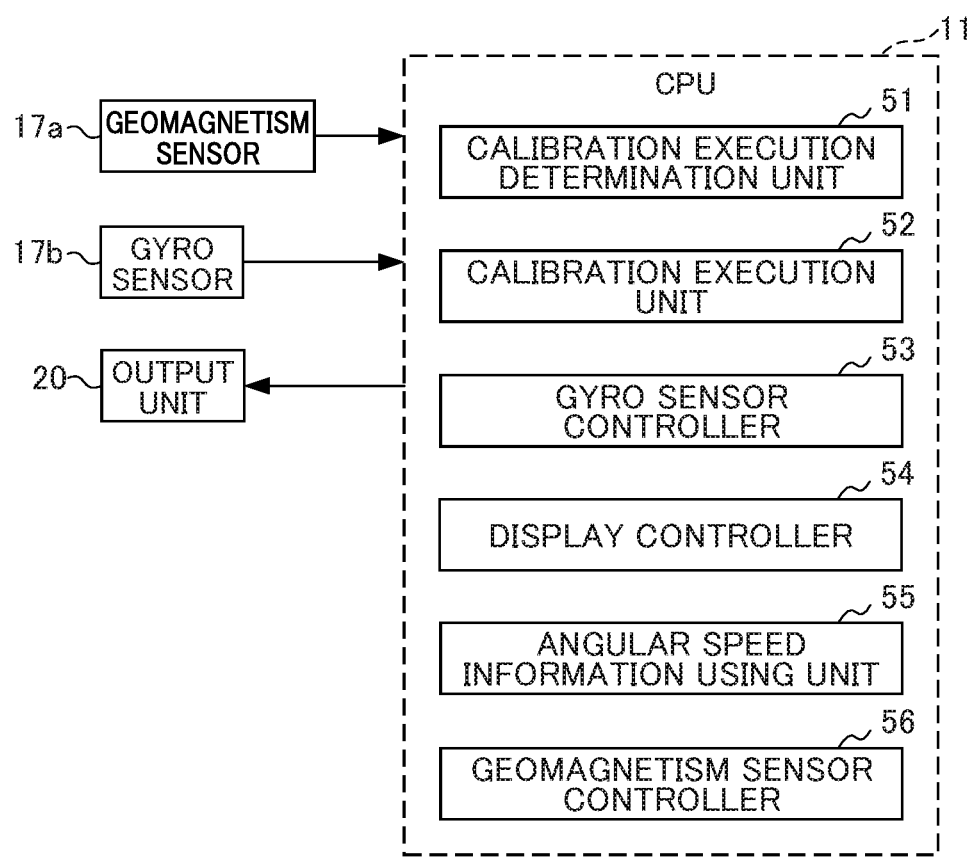
FIG. 9 is a functional block diagram illustrating a functional configuration for executing a calibration control process in a fourth embodiment.

FIG. 9 is a functional block diagram illustrating a functional configuration for executing the calibration control process in the fourth embodiment.

In FIG. 9, a functional configuration other than the geomagnetism sensor controller 56 is substantially the same as the functional configuration of FIG. 3 in the first embodiment.

The geomagnetism sensor controller 56 turns ON or OFF the geomagnetism sensor 17a according to an instruction of the calibration execution unit 52.

[Calibration Control Process]

Figure 10:
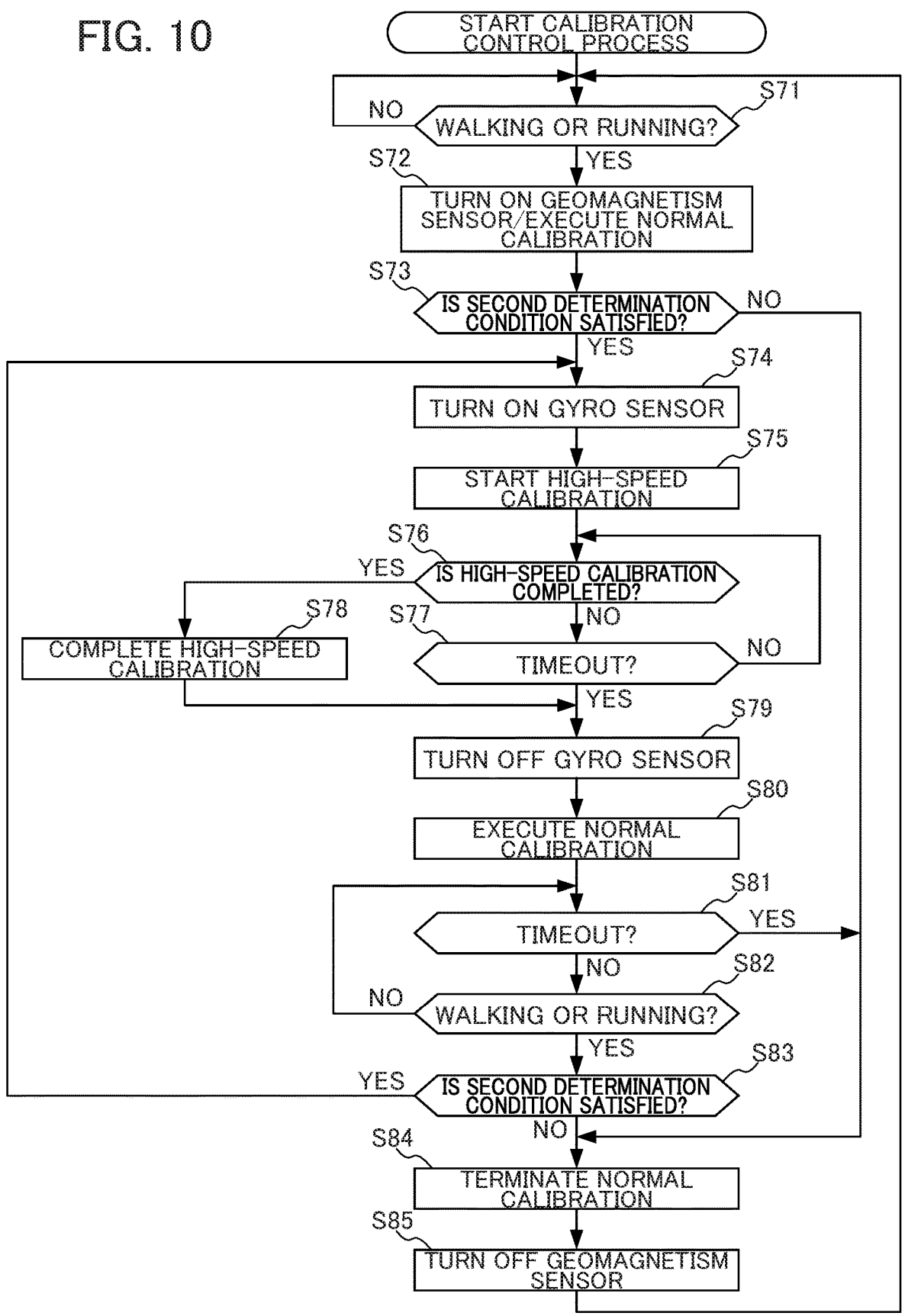
FIG. 10 is a flowchart for description of a flow of the calibration control process executed by an electronic device in the fourth embodiment.

FIG. 10 is a flowchart for description of a flow of the calibration control process executed by the electronic device 1 in the fourth embodiment.

The calibration control process is started at a time of power activation of the electronic device 1, and terminated when an operation of turning OFF the power source of the electronic device 1 is performed.

In step S71, the calibration execution determination unit 51 determines whether or not the user is walking or running by analyzing an action of the user.

A reason for determining whether or not the user is walking or running is that calibration can be efficiently executed by using the motion.

Here, it is determined whether or not the user is walking or running. However, it is possible to determine a motion other than walking or running when the motion can be used for execution of calibration.

When the user is neither walking nor running, NO is determined in step S71, and the process of step S71 is repeated.

On the other hand, when the user is walking or running, YES is determined in step S71, and the process proceeds to step S72.

In step S72, the calibration execution unit 52 outputs an instruction to turn ON the geomagnetism sensor 17a to the geomagnetism sensor controller 56 and executes normal calibration.

In this way, the geomagnetism sensor 17a is turned ON by the geomagnetism sensor controller 56, and normal calibration of the geomagnetism sensor 17a is started.

In step S73, the calibration execution determination unit 51 determines whether or not the second determination condition for determining whether or not calibration is necessary based on an accumulation situation of errors of magnetism in the electronic device 1 is satisfied by executing the second determination process.

When the second determination condition is not satisfied, NO is determined in step S73, and the process proceeds to step S84.

On the other hand, when the second determination condition is satisfied, YES is determined in step S73, and the process proceeds to step S74.

In step S74, the calibration execution unit 52 outputs an instruction to turn ON the gyro sensor 17b to the gyro sensor controller 53.

In this way, the gyro sensor 17b is turned ON by the gyro sensor controller 53.

In step S75, the calibration execution unit 52 starts high-speed calibration using the gyro sensor 17b which is turned ON in step S74.

In step S76, the calibration execution unit 52 determines whether high-speed calibration is completed.

When high-speed calibration is not completed, NO is determined in step S76, and the process proceeds to step S77.

On the other hand, when high-speed calibration is completed, YES is determined in step S76, and the process proceeds to step S78.

In step S77, the calibration execution unit 52 determines whether or not the timeout set as the completion time of high-speed calibration has occurred.

When the timeout set as the completion time of high-speed calibration has not occurred, NO is determined in step S77, and the process proceeds to step S76.

On the other hand, when the timeout set as the completion time of high-speed calibration has occurred, YES is determined in step S77, and the process proceeds to step S79.

In step S78, the calibration execution unit 52 completes high-speed calibration.

After step S78, the process proceeds to step S79.

In step S79, the calibration execution unit 52 outputs an instruction to turn OFF the gyro sensor 17b to the gyro sensor controller 53.

In this way, the gyro sensor 17b is turned OFF by the gyro sensor controller 53.

In step S80, the calibration execution unit 52 executes normal calibration not using the gyro sensor 17b.

In this way, high-speed calibration is attempted, and it is possible to shift to a state in which normal calibration is performed when high-speed calibration is completed and when timeout of high-speed calibration occurs.

In step S81, the calibration execution unit 52 determines whether or not a timeout set as a completion time of normal calibration has occurred.

When the timeout set as the completion time of normal calibration has not occurred, NO is determined in step S81, and the process proceeds to step S82.

On the other hand, when the timeout set as the completion time of normal calibration has occurred, YES is determined in step S81, and the process proceeds to step S84.

In step S82, the calibration execution determination unit 51 determines whether or not the user is walking or running by analyzing an action of the user.

A reason for determining whether or not the user is walking or running is that calibration can be executed by using the motion.

Here, it is determined whether or not the user is walking or running. However, it is possible to determine a motion other than walking or running when the motion can be used for execution of calibration.

When the user is neither walking nor running, NO is determined in step S82, and the process proceeds to step S81. On the other hand, when the user is walking or running, YES is determined in step S82, and the process proceeds to step S83.

In step S83, the calibration execution determination unit 51 determines whether or not the second determination condition for determining whether or not calibration is necessary based on an accumulation situation of errors of magnetism in the electronic device 1 is satisfied by executing the second determination process.

When the second determination condition is not satisfied, NO is determined in step S83, and the process proceeds to step S84.

On the other hand, when the second determination condition is satisfied, YES is determined in step S83, and the process proceeds to step S74.

It is possible to invert a processing order of determination as to whether or not the user is walking or running in step S82 and determination as to whether or not the second determination condition is satisfied in step S83.

In step S84, the calibration execution unit 52 terminates normal calibration.

In step S85, the calibration execution unit 52 outputs an instruction to turn OFF the geomagnetism sensor 17a to the geomagnetism sensor controller 56.

In this way, the geomagnetism sensor 17a is turned OFF by the geomagnetism sensor controller 56.

After step S85, the process proceeds to step S71.

After calibration is executed in steps S72, S79, and S80, the electronic device 1 measures an elapsed time from immediately preceding calibration, a movement distance from an immediately preceding calibration point, a cumulative posture change amount from a time of immediately preceding calibration, or a cumulative magnetic field change amount from a time point of immediately preceding calibration by a background process, etc.

According to such a process, in the electronic device 1, while the geomagnetism sensor 17a is normally turned OFF so that normal calibration is not performed, the geomagnetism sensor 17a may be turned ON to execute normal calibration when it is determined that the user is walking or running, and the gyro sensor 17b may be turned ON to perform high-speed calibration when the second determination condition is satisfied.

Therefore, it is possible to reduce a period in which the geomagnetism sensor 17a and the gyro sensor 17b are turned ON, and it is possible to perform high-speed calibration of the geomagnetism sensor 17a with lower power consumption.

[Modification 1]

In the each of the above-described embodiments, normal calibration is executed when the timeout set as the completion time of high-speed calibration occurs. However, the invention is not limited thereto.

For example, when the timeout set as the completion time of high-speed calibration occurs, the calibration execution unit 52 may terminate calibration at this point in time without performing normal calibration.

Then, the calibration execution unit 52 may adjust an execution timing of high-speed calibration, and re-execute high-speed calibration after a preset time.

In this way, in a situation in which it is considered that a magnetic field environment is defective and a current timing is unsuitable for calibration, etc., it is possible to re-execute high-speed calibration at a subsequent timing at which high-speed calibration is executable.

The electronic device 1 configured as described above includes the geomagnetism sensor 17a, the gyro sensor 17b, the calibration execution unit 52, the gyro sensor controller 53, and the calibration execution determination unit 51.

The calibration execution unit 52 calibrates an output error of the geomagnetism sensor 17a so that the geomagnetism sensor 17a can output more accurate geomagnetism data based on angular speed data output by the gyro sensor 17b.

The gyro sensor controller 53 controls turning ON/OFF of the gyro sensor 17b.

The calibration execution determination unit 51 determines whether or not calibration of the geomagnetism sensor 17a is necessary.

When the calibration execution determination unit 51 determines that calibration of the geomagnetism sensor 17a is unnecessary, the gyro sensor controller 53 performs a control operation to turn OFF the gyro sensor 17b.

According to such a process, in the electronic device 1, when calibration of the geomagnetism sensor 17a by using the gyro sensor 17b is completed, the gyro sensor 17b is turned OFF.

For this reason, it is possible to further reduce a period during which the gyro sensor 17b is turned ON, and it is possible to perform calibration of the geomagnetism sensor 17a by using the gyro sensor 17b with lower power consumption.

That is, according to the electronic device 1, it is possible to suppress an increase in power consumption involved in calibration for calibrating an offset of the geomagnetism sensor 17a.

When the calibration execution determination unit 51 determines that calibration of the geomagnetism sensor 17a is unnecessary and when the gyro sensor 17b is not used for another process, the gyro sensor controller 53 performs a control operation to turn OFF the gyro sensor 17b.

In this way, when the gyro sensor 17b is not used, it is possible to turn OFF the gyro sensor 17b and to suppress an increase in power consumption.

In addition, the electronic device 1 includes the angular speed information using unit 55.

The angular speed information using unit 55 acquires predetermined information by using the gyro sensor 17b.

The gyro sensor controller 53 turns ON the gyro sensor 17b while the predetermined information is acquired by the angular speed information using unit 55.

While the predetermined information is acquired by the angular speed information using unit 55, the calibration execution unit 52 calibrates an output error of the geomagnetism sensor 17a by using angular speed data output by the gyro sensor 17b.

In this way, it is possible to perform calibration of the geomagnetism sensor 17a by using the gyro sensor 17b with lower power consumption by utilizing a timing at which the gyro sensor 17b is turned ON by the function other than the application using the geomagnetism sensor 17a (the angular speed information using unit 55 that acquires the predetermined information based on the angular speed data).

When the calibration execution determination unit 51 determines that calibration of the geomagnetism sensor 17a is necessary, the gyro sensor controller 53 performs a control operation to turn ON the gyro sensor 17b.

In this way, it is possible to further reduce the period during which the gyro sensor 17b is turned ON, and to perform high-speed calibration of the geomagnetism sensor 17a with lower power consumption.

The calibration execution determination unit 51 determines whether or not calibration of the geomagnetism sensor 17a is necessary (i) by determining whether or not magnetic accuracy of the geomagnetism sensor 17a is favorable and/or (ii) by determining whether or not the user of the electronic device 1 is performing an operation available for calibration of an output error of the geomagnetism sensor 17a.

In this way, when accuracy of the geomagnetism sensor 17a is decreasing or when the user of the electronic device 1 is performing the operation available for calibration of the output error of the geomagnetism sensor 17a, it is possible to perform calibration of the geomagnetism sensor 17a by using the gyro sensor 17b.

The calibration execution determination unit 51 determines whether or not the user of the electronic device 1 is performing the operation available for calibration of the output error of the geomagnetism sensor 17a.

When the calibration execution determination unit 51 determines that the user of the electronic device 1 is performing the operation available for calibration of the output error of the geomagnetism sensor 17a, the calibration execution unit 52 performs calibration of the output error of the geomagnetism sensor 17a.

In this way, it is possible to efficiently execute calibration of the geomagnetism sensor 17a by using the operation of the user.

When the calibration execution determination unit 51 determines that calibration of the geomagnetism sensor 17a is necessary and the user of the electronic device 1 is performing the operation available for calibration of the output error of the geomagnetism sensor 17a, the calibration execution unit 52 performs calibration of the output error of the geomagnetism sensor 17a.

In this way, in a situation in which an action of the user can be used for calibration of the geomagnetism sensor 17a, when accuracy of the geomagnetism sensor 17a is decreasing, it is possible to efficiently execute calibration of the geomagnetism sensor 17a.

The calibration execution unit 52 can execute a first calibration process (high-speed calibration) of calibrating an output error of the geomagnetism sensor 17a so that the geomagnetism sensor 17a can more accurately output geomagnetism data based on angular speed data output by the gyro sensor 17b and a second calibration process (normal calibration) of calibrating an output error of the geomagnetism sensor 17a so that the geomagnetism sensor 17a can more accurately output geomagnetism data without using angular speed data output by the gyro sensor 17b.

The gyro sensor controller 53 turns ON the gyro sensor 17b and the calibration execution unit 52 executes the first calibration process in a case in which the calibration execution determination unit 51 determines that calibration of the geomagnetism sensor 17a is necessary, and the calibration execution unit 52 executes the second calibration process in a case other than a case in which the calibration execution determination unit 51 determines that calibration of the geomagnetism sensor 17a is necessary.

In this way, it is possible to more rapidly execute calibration of the geomagnetism sensor 17a when calibration is necessary while maintaining accuracy of the geomagnetism sensor 17a.

The calibration execution unit 52 executes the second calibration process usually, and the gyro sensor controller 53 turns ON the gyro sensor 17b and the calibration execution unit 52 executes the first calibration process when the calibration execution determination unit 51 determines that calibration of the geomagnetism sensor 17a is necessary.

In this way, it is possible to reduce a period during which the gyro sensor 17b is turned ON, and it is possible to perform high-speed calibration of the geomagnetism sensor 17a with lower power consumption while maintaining accuracy of the geomagnetism sensor 17a usually.

The calibration execution unit 52 adjusts a calibration timing of calibration of the geomagnetism sensor 17a.

The gyro sensor controller 53 performs a control operation to turn ON and OFF the gyro sensor 17b based on the calibration timing adjusted by the calibration execution unit 52.

In this way, in a situation in which it is considered that a magnetic field environment is defective and a current timing is unsuitable for calibration, etc., it is possible to re-execute calibration using the gyro sensor 17b at a subsequent timing at which calibration using the gyro sensor 17b is executable.

The calibration execution determination unit 51 measures at least one of an elapsed time from immediately preceding calibration, a movement distance from an immediately preceding calibration point, a posture change amount from a time of immediately preceding calibration, and a cumulative magnetic field change amount from immediately preceding calibration, and determines that calibration of the geomagnetism sensor 17a is necessary when a measurement result exceeds a predetermined threshold value.

In this way, it is possible to determine whether or not calibration is necessary based on an accumulation situation of errors of magnetism in the electronic device 1.

In addition, the electronic device 1 includes the geomagnetism sensor 17a, the gyro sensor 17b, the calibration execution unit 52, the gyro sensor controller 53, and the angular speed information using unit 55.

The calibration execution unit 52 performs calibration of an output error of the geomagnetism sensor 17a so that the geomagnetism sensor 17a can output more accurate geomagnetism data based on angular speed data output by the gyro sensor 17b.

The gyro sensor controller 53 controls turning ON/OFF of the gyro sensor 17b.

The angular speed information using unit 55 acquires predetermined information by utilizing the gyro sensor 17b.

The gyro sensor controller 53 turns ON the gyro sensor 17b while the predetermined information is acquired by the angular speed information using unit 55.

The calibration execution unit 52 performs calibration of an output error of the geomagnetism sensor 17a by utilizing the angular speed data output by the gyro sensor 17b while the predetermined information is acquired by the angular speed information using unit 55.

In this way, it is possible to perform calibration of the geomagnetism sensor 17a by using the gyro sensor 17b with lower power consumption using a timing at which the gyro sensor 17b is turned ON by the function other than the application using the geomagnetism sensor 17a (the angular speed information using unit 55 that acquires predetermined information based on the angular speed data).

It should be noted that the present invention is not to be limited to the aforementioned embodiments, and that modifications, improvements, etc. within a scope that can achieve the objects of the present invention are also included in the present invention.

In the above-described embodiments, in a case in which a schedule of a process using the gyro sensor 17b is determined (for example, in a case in which exercise data of the user is intermittently acquired, etc.), high-speed calibration of the geomagnetism sensor 17a may be executed according to this schedule.

In addition, when it is necessary to perform high-speed calibration of the geomagnetism sensor 17a, and when the schedule of the process using the gyro sensor 17b is approaching within a predetermined time, the schedule may be advanced to turn ON the gyro sensor 17b, and high-speed calibration of the geomagnetism sensor 17a may be performed.

In addition, in the above-described embodiments, in step S8 of the calibration control process, only the first determination condition for determining whether or not calibration is necessary based on the operation executed in the electronic device 1 is determined. However, the invention is not limited thereto.

For example, in step S8 of the calibration control process, the second determination condition for determining whether or not calibration is necessary based on an accumulation situation of errors of magnetism in the electronic device 1 may be determined in addition to the first determination condition, and the gyro sensor 17b may be turned ON to start high-speed calibration when the first determination condition or the second determination condition is satisfied.

In this way, high-speed calibration may be more rapidly performed in a situation in which calibration of the geomagnetism sensor 17a in the electronic device 1 is necessary.

Furthermore, only one of the first determination condition and the second determination condition may be determined in step S2 of the calibration control process, and only the second determination condition may be determined in step S8 of the calibration control process.

In this way, by setting one or both of the first determination condition and the second determination condition as a determination target as necessary, it is possible to flexibly realize a target device configuration.

In addition, in the above-described embodiments, in the case of determining the second determination condition, a level representing an accumulation situation of errors of magnetism in the electronic device 1 may be set in multiple stages, and a degree of this level may be determined in the electronic device 1.

For example, a higher level (for example, "level 3") may be set for smaller accumulation of errors of magnetism in the electronic device 1, and an accumulation situation of errors of magnetism in which calibration is necessary may be set to a lowest level (for example, "level 0").

When a level is set in this way, it is possible to more easily determine an accumulation situation of errors of magnetism in the electronic device 1.

In addition, in the above-described embodiments, the watch type device (smartwatch, etc.) has been given as an example of the electronic device 1 to which the invention is applied. However, the invention is not particularly limited thereto.

For example, the invention is applicable to a general electronic device having a calibration function of the geomagnetism sensor.

Specifically, for example, the invention can be applied to a laptop personal computer, a television receiver, a video camera, a portable navigation device, a mobile phone, a smartphone, a portable game machine, etc.

The processing sequence described above can be executed by hardware, and can also be executed by software.

In other words, the hardware configuration of FIGS. 5 and 7 is merely an illustrative example, and the present invention is not particularly limited thereto. More specifically, the types of functional blocks employed to realize the above-described functions are not particularly limited to the examples shown in FIGS. 5 and 7, so long as the analysis system S can be provided with the functions enabling the aforementioned processing sequence to be executed in its entirety.

A single functional block may be configured by a single piece of hardware, a single installation of software, or a combination thereof.

The functional configurations of the present embodiment are realized by a processor executing arithmetic processing, and processors that can be used for the present embodiment include a unit configured by a single unit of a variety of single processing devices such as a single processor, multiprocessor, multi-core processor, etc., and a unit in which the variety of processing devices are combined with a processing circuit such as ASIC (Application Specific Integrated Circuit) or FPGA (Field-Programmable Gate Array).

In addition, in a case in which the invention is applied to a device including a plurality of entities performing arithmetic processing such as a multiprocessor, a multi-core processor, a combination of various processing devices and processing circuits, etc., by executing a calibration control process by one arithmetic processing entity, a result of the calibration control process may be used by each arithmetic processing entity regardless of an operating state of another arithmetic processing entity (a pause state, a sleep state, a state in which other processing is being executed, etc.).

In the case of having the series of processing executed by software, the program constituting this software is installed from a network or recording medium to a computer or the like.

The computer may be a computer equipped with dedicated hardware. In addition, the computer may be a computer capable of executing various functions, e.g., a general purpose personal computer, by installing various programs.

The storage medium containing such a program can not only be constituted by the removable medium 231 of FIG. 4 distributed separately from the device main body for supplying the program to a user, but also can be constituted by a storage medium or the like supplied to the user in a state incorporated in the device main body in advance. The removable medium 231 is composed of, for example, a magnetic disk (including a floppy disk), an optical disk, a magnetic optical disk, or the like. The optical disk is composed of, for example, a CD-ROM (Compact Disk-Read Only Memory), a DVD (Digital Versatile Disk), Blu-ray (Registered Trademark) or the like. The magnetic optical disk is composed of an MD (Mini-Disk) or the like. The storage medium supplied to the user in a state incorporated in the device main body in advance is constituted by, for example, the ROM 112 and 212 of FIGS. 3 and 4 in which the program is recorded or a hard disk, etc. included in the storage unit 119 and 220 of FIGS. 3 and 4.

It should be noted that, in the present specification, the steps defining the program recorded in the storage medium include not only the processing executed in a time series following this order, but also processing executed in parallel or individually, which is not necessarily executed in a time series.

Further, in the present specification, the terminology of the system means an entire apparatus including a plurality of apparatuses and a plurality of units.

The embodiments of the present invention described above are only illustrative, and are not to limit the technical scope of the present invention. The present invention can assume various other embodiments. Additionally, it is possible to make various modifications thereto such as omissions or replacements within a scope not departing from the spirit of the present invention. These embodiments or modifications thereof are within the scope and the spirit of the invention described in the present specification, and within the scope of the invention recited in the claims and equivalents thereof.

What is claimed is:

1. An electronic device comprising:
a geomagnetism sensor;
an angular speed sensor; and
a processor configured to:
  determine whether at least a first determination condition is satisfied, wherein the first determination condition indicates that calibration of an output error of the geomagnetism sensor is appropriate based on activity of a user;
  in response to at least determining that the first determination condition is satisfied, perform a control operation to turn ON the angular speed sensor to acquire angular speed data;
  start to perform a first calibration of the output error of the geomagnetism sensor based on the angular speed data acquired by the angular speed sensor;
  determine whether or not a timeout set as a completion time of the first calibration of the output error has occurred during performing the first calibration of the output error; and
  in response to determining that the timeout has occurred during performing the first calibration of the output error, perform a control operation to turn OFF the angular speed sensor and then start to perform a second calibration of the output error of the geomagnetism sensor without the angular speed data acquired by the angular speed sensor.

2. The electronic device according to claim 1,
wherein the processor is further configured to:
  perform a control operation to turn OFF the angular speed sensor when it is determined that calibration of the geomagnetism sensor is unnecessary and when the angular speed sensor is not used for another process.

3. The electronic device according to claim 1,
wherein the processor is further configured to:
  acquire predetermined information by using the angular speed sensor;
  turn ON the angular speed sensor while the predetermined information is acquired; and
  perform calibration of an output error of the geomagnetism sensor by using the angular speed data output by the angular speed sensor while the predetermined information is acquired.

4. The electronic device according to claim 1,
wherein the processor is further configured to:
  perform a control operation to turn ON the angular speed sensor when it is determined that calibration of the geomagnetism sensor is necessary.

5. The electronic device according to claim 1,
wherein the processor is further configured to:
  determine whether or not calibration of the geomagnetism sensor is necessary (i)by determining whether or not magnetic accuracy of the geomagnetism sensor exceeds a predetermined threshold value and/or (ii)by determining whether or not a user of the electronic device is performing an operation available for calibration of an output error of the geomagnetism sensor.

6. The electronic device according to claim 1,
wherein the processor is further configured to:
  determine whether or not the user of the electronic device is performing an operation available for calibration of an output error of the geomagnetism sensor; and
  perform calibration of the output error of the geomagnetism sensor when it is determined that the user of the electronic device is performing the operation available for calibration of the output error of the geomagnetism sensor.

7. The electronic device according to claim 6,
wherein the processor is further configured to:
  perform calibration of the output error of the geomagnetism sensor when (i) it is determined that calibration of the geomagnetism sensor is necessary and (ii) it is determined that the user of the electronic device is performing the operation available for calibration of the output error of the geomagnetism sensor.

8. The electronic device according to claim 6,
wherein the calibration comprises:
  a first calibration process of calibrating the output error of the geomagnetism sensor so that the geomagnetism sensor is allowed to output more accurate geomagnetism data based on the angular speed data output by the angular speed sensor; and
  a second calibration process of calibrating the output error of the geomagnetism sensor so that the geomagnetism sensor is allowed to output more accurate geomagnetism data without using the angular speed data output by the angular speed sensor, and
wherein the angular speed sensor is turned ON and the first calibration process is executed in a case in which it is determined that calibration of the geomagnetism sensor is necessary, and the second calibration process is executed in a case other than a case in which it is determined that calibration of the geomagnetism sensor is necessary.

9. The electronic device according to claim 8,
wherein the processor is further configured to:
  execute the second calibration process usually, and turn ON the angular speed sensor and execute the first calibration process in a case in which it is determined that calibration of the geomagnetism sensor is necessary.

10. The electronic device according to claim 1,
wherein the processor is further configured to:
  adjust a calibration timing of calibration of the geomagnetism sensor; and
  perform a control operation to turn ON and OFF the angular speed sensor based on the adjusted calibration timing.

11. The electronic device according to claim 1,
wherein the processor is further configured to:
  measure at least one of an elapsed time from immediately preceding calibration, a movement distance from an immediately preceding calibration point, a posture change amount from a time of immediately preceding calibration, and a cumulative magnetic field change amount from immediately preceding calibration, and determine that calibration of the geomagnetism sensor is necessary when a measurement result exceeds a predetermined threshold value.

12. A calibration control method executed by an electronic device including a processor, a geomagnetism sensor, and an angular speed sensor, the calibration control method comprising:
  determining, by the processor, whether at least a first determination condition is satisfied, wherein the first determination condition indicates that calibration of an output error of the geomagnetism sensor is appropriate based on activity of a user;

in response to at least determining that the first determination condition is satisfied, performing, by the processor, a control operation to turn ON the angular speed sensor to acquire angular speed data;

starting to perform, by the processor, a first calibration of the output error of the geomagnetism sensor based on the angular speed data acquired by the angular speed sensor;

determining, by the processor, whether or not a timeout set as a completion time of the first calibration of the output error has occurred during performing the first calibration of the output error;

in response to determining that the timeout has occurred during performing the first calibration of the output error, performing, by the processor, a control operation to turn OFF the angular speed sensor and then starting to perform a second calibration of the output error of the geomagnetism sensor without the angular speed data acquired by the angular speed sensor.

13. A non-transitory computer-readable storage medium storing a program that is executed by a computer that comprises a processor, a geomagnetism sensor, and an angular speed sensor, the program being executable to cause the computer to perform operations comprising:

determining whether at least a first determination condition is satisfied, wherein the first determination condition indicates that calibration of an output error of the geomagnetism sensor is appropriate based on activity of a user;

in response to at least determining that the first determination condition is satisfied, performing a control operation to turn ON the angular speed sensor to acquire angular speed data;

starting to perform a first calibration of the output error of the geomagnetism sensor based on the angular speed data acquired by the angular speed sensor;

determining whether or not a timeout set as a completion time of the first calibration of the output error has occurred during performing the first calibration of the output error; and in response to determining that the timeout has occurred during performing the first calibration of the output error, performing a control operation to turn OFF the angular speed sensor and then starting to perform a second calibration of the output error of the geomagnetism sensor without the angular speed data acquired by the angular speed sensor.

* * * * *